United States Patent [19]

Testani

[11] 3,903,484

[45] Sept. 2, 1975

[54] LOW DISTORTION, AMPLITUDE STABLE QUADRATURE OSCILLATOR

[75] Inventor: Alan J. Testani, Endicott, N.Y.

[73] Assignee: The United States of America as represented by the Secretary of the Navy, Washington, D.C.

[22] Filed: June 24, 1974

[21] Appl. No.: 482,308

[52] U.S. Cl. .................................. 331/135; 331/183

[51] Int. Cl.$^2$ ......................... H03B 3/02; H03B 5/20

[58] Field of Search ............ 331/135, 109, 182, 183

[56] References Cited

UNITED STATES PATENTS 3,396,347 8/1968 Richman et al. ................ 331/183 X 3,815,048 6/1974 Hamlet .............................. 331/109

*Primary Examiner*—Siegfried H. Grimm

*Attorney, Agent, or Firm*—R. S. Sciascia; Henry Hansen; R. J. Mooney

[57] ABSTRACT

A quadrature oscillator is provided with a device which senses the output of the oscillator and compares it with a precision reference voltage to thereby obtain a signal which is used as the supply voltage provided to the integrating stages of the oscillator. By so controlling the supply voltage, the output of the oscillator is automatically amplitude stabilized and distortion is reduced.

6 Claims, 1 Drawing Figure

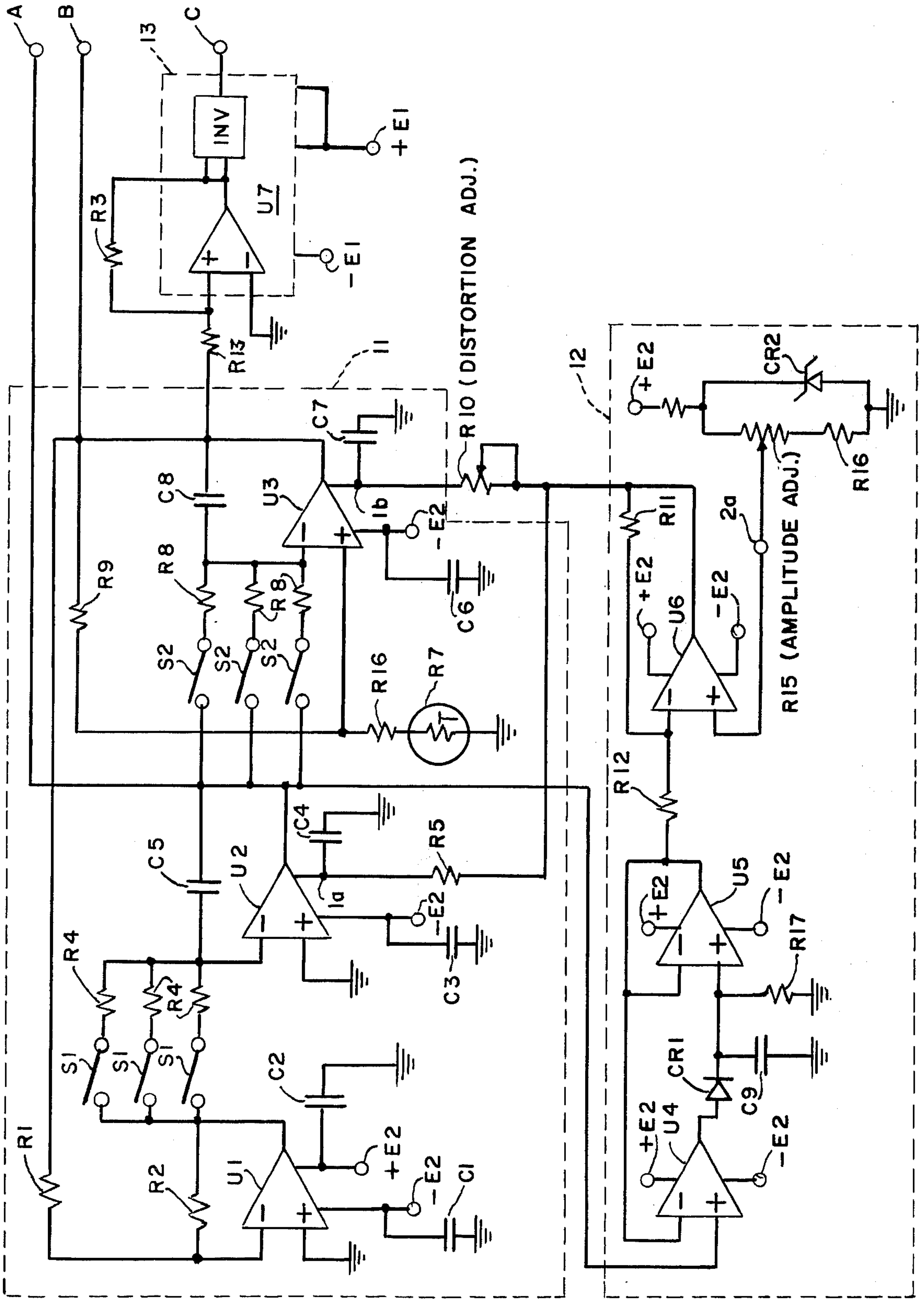
A
B
C
13
INV
+E1
-E1
U7
R3
R13
11
12
R10 (DISTORTION ADJ.)
+E2
-E2
CR2
R16
R15 (AMPLITUDE ADJ.)
2a
R11
U6
U3
1b
C7
C8
C6
R8
S2
R9
R16
R7
R12
U5
R17
CR1
C9
U4
C5
U2
C4
R5
1a
C3
R4
S1
C2
U1
R1
R2
C1

LOW DISTORTION, AMPLITUDE STABLE QUADRATURE OSCILLATOR

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates to devices for controlling the amplitude of oscillator signals and in particular to amplitude controlling devices which automatically vary the supply voltage to the active elements of an oscillator.

It is well known that the exponential build up of a self-starting oscillator will continue as long as the average gain over the cycle is greater than a threshold value. Eventually, the amplitude of the output sinusoid is limited as the peaks of the sinusoid force the instantaneous operating point of the oscillator's active element (tube or transistor) into the nonlinear regions. Several schemes are presently used to control oscillator amplitude levels, among these are active element limiting, bias limiting, feedback limiting and automatic gain control.

With respect to a specific class of oscillators, namely quadrature oscillators, two methods of amplitude stabilization are presently used. The first of these methods requires that the oscillator be designed for a slightly divergent output signal which is then bounded by the use of non-linear amplitude limiting devices. The second of these methods requires a device which senses the output amplitude of the oscillator and compares it with a reference signal to derive an error signal which is ultimately used for automatic gain control purposes. Oscillators designed according to the first method sometimes produce unacceptably distorted output signals although such oscillators are often satisfactory for fixed frequency applications in the range of 1 Hz to 10 KHz. Oscillators designed according to the second method provide better performance, i.e., their outputs are less distorted, but at the cost of increased circuit complexity.

SUMMARY OF THE INVENTION

Accordingly, it is an object of this invention to provide an oscillator which produces an output having low distortion and high amplitude stability. It is a further object of this invention to provide a basic double integrating quadrature oscillator with means for limiting the oscillator amplitude by automatically adjusting the supply voltage to the integrating amplifiers. These and other objects of the invention are achieved as follows.

A conventional double integrating quadrature oscillator, comprising an inverter stage and two integrating operational amplifier stages, is provided with means for automatically varying or controlling the bias supply to the integrating stages. The varying or controlling means includes detector means for sensing the output of the oscillator and for producing a cognate signal related to said oscillator output and means for comparing said cognate signal with a precision reference voltage to thereby develop a signal which is used as the bias supply to the integrating stages of the oscillator. By so controlling the supply voltage, the output of the oscillator is automatically stabilized and distortion is reduced.

Other objects, advantages, and novel features of the invention will become apparent from the following detailed description of the invention when considered in conjunction with the accompanying drawings.

BRIEF DESCRIPTION OF THE DRAWINGS

The sole FIGURE shows a known quadrature oscillator provided with means for limiting oscillator amplitude according to the invention.

DESCRIPTION OF THE PREFERRED EMBODIMENT

Referring to the sole FIGURE, stage 11 is a conventional double integrating quadrature oscillator such as that described in "Operational Amplifiers Design and Applications," J. G. Graeme et al., McGraw-Hill, 1971, at pages 385 to 391. The oscillator 11 includes an inverting operational amplifier U1 and two integrating operational amplifiers U2 and U3 all of which are arranged to solve the differential equation $X + \omega_o^2 X = 0$, as is well known. (As will be explained more fully hereinbelow, the known quadrature oscillator 11 has been modified to allow operation at several frequencies.) The oscillator 11 provides sine and cosine output signals at output terminals A and B respectively. Stage 13 is a conventional crossover detector which provides a square wave output at terminal C. Stage 12 automatically adjusts the positive bias supply provided to the integrating operational amplifiers U2, U3 at terminals 1a and 1b respectively.

As is well known the frequency of the sinusoidal oscillator 11 is determined by the condition that the loop phase shift is zero. Oscillations are not sustained if, at the oscillator frequency, the magnitude of the loop gain is less than unity. It is impossible to obtain a loop gain precisely equal to unity over wide temperature variations while maintaining relative frequency stability. Therefore, a small amount of positive feedback is introduced to sustain the oscillations. However, this positive feedback causes a slight increase in amplitude of the signal as it travels around the loop. The signal amplitude continues to increase until it operates in the non-linear portion of the transfer characteristic of one of the circuit elements. Thus, in practice, the loop gain is slightly larger than unity, and the amplitude of the oscillations is limited by the onset of non-linearity.

Stage 12 provides a "controlled non-linearity" by adjusting the positive bias supply on the integrating amplifiers U2, U3. Since a non-linearity exists in every circuit as the operating values approach the bias supplies, slight controlled variations in supply voltage are used to regulate the amplitude of oscillations.

The operation of stage 12 is as follows. Amplifier U4 acts as a buffer amplifier. Its input is the sinusoid whose amplitude is to be controlled. This sinusoid is peak detected by diode CR1 and capacitor C9. The peak detector output is buffered by amplifier U5 and compared in amplifier U6 with a precision reference voltage at 2a. The output of amplifier U6 is therefore an error voltage superimposed on a reference level and becomes the positive bias supply of amplifiers U2 and U3 of stage 1.

Since, as aforementioned, an amplifier saturates as operating conditions approach the levels of the bias supplies, (which is the non-linearity used to control oscillation amplitude) changing one bias supply controls the oscillation amplitude. Therefore, stage 12 controls the saturation point of amplifiers U2 and U3 of stage 11. Potentiometer R10 allows the saturation points of U2 and U3 to occur at precisely the same output voltage of stage 12. Stage 12 is thus a dynamic correcting stage and hence, the amplitude stability of the circuit is very high. Also, stage 12, by presenting a "soft nonlinearity" eliminates flattening of the output sinusoids and hence, provides a low distortion characteristic of the circuit.

The operating frequency of the oscillator 11 is given by $$f = \frac{1}{2\pi RC}$$

where R = R4 = R8 and C = C5 = C8 of stage 11. The frequency of the circuit can be changed by switching in different values of resistance R. The circuit automatically locks in the new frequency at the same amplitude in less than one cycle of the new frequency. Switching is accomplished by means of the switches S1 and S2 in stage 11. Switches S1 and S2 may be manual or electronic switches.

In order to permit the oscillator to effectively perform at several selectable frequencies, one modification must be made to stage 12. It is clear from an inspection of the sole FIGURE that it is easy to put energy into capacitor C9 of stage 12 but very difficult to remove it due to the very high input impedance of U5. Therefore, a high value bleeder resistor R17 is placed in parallel with C9.

A free running quadrature oscillator constructed with components having proper temperature coefficients and in accordance with the principles of this invention will provide an output signal having a relatively high amplitude stability (less than 1 percent between −55°C and +55°C) and relatively low distortion (less than 1 percent).

The following table is a list of typical examples of component types employed in the preferred embodiment:

TABLE

| | |
|---|---|
| S1, S2 | Transistorized switches |
| U1, U2, U3, U4, U5, U6 | Operational Amplifier |
| U7 | Voltage Comparator |
| C5, C8 | ±1%, −200 ±30 Parts Per Million Temperature Coefficient Film Capacitor |
| R1, R2, R4, R6, R8, R9, R11, R12, R14, R16, R17 | Metal Film ±50 Parts Per Million Resistor |
| C1, C2, C3, C4, C6, C7, C9 | Ceramic Capacitor |
| R10, R15 | Cermet Potentiometer |
| R3, R5, R13 | Carbon Composition Resistors |
| R7 | Temperature Sensing Silicon Resistor Approximate Temperature Coefficient +0.7%/°C. |
| E1 | 5 volts |
| E2 | 15 volts |

Obviously, many modifications and variations of the present invention are possible in the light of the above teachings. It is therefore to be understood that within the scope of the appended claims the invention may be practiced otherwise than as specifically described.

I claim:

1. A quadrature oscillator including a first integrating operational amplifier, a second integrating operational amplifier operatively connected to the output of said first amplifier and an inverting operational amplifier operatively connected between the input of said first amplifier and the output of said second amplifier and further including control means for controlling the amplitude of the quadrature oscillator output signal wherein the improvement comprises an improved control means comprising:

peak detector means responsive to said oscillator output signal for generating a peak detected signal related to said oscillator output signal;

reference means for generating a reference signal;

comparator means responsive to said reference signal and to said peak detected signal for developing a supply voltage; and means for providing said supply voltage to said first and second integrating operational amplifiers.

2. An improved control means as in claim 1 wherein said peak detector means includes:

a first buffer amplifier responsive to said oscillator output signal;

a second buffer amplifier;

a diode having its anode terminal operatively connected to the output of said first buffer amplifier and having its cathode terminal operatively connected to the input of said second buffer amplifier; and a capacitor connected between said diode cathode terminal and a reference potential.

3. An improved control means as in claim 2 wherein said comparator means includes:

a differential amplifier for generating said supply voltage wherein said supply voltage is an error voltage superimposed on a reference level.

4. In combination with a quadrature oscillator having a first integrating operational amplifier, a second integrating operational amplifier operatively connected to the output of said first amplifier, and an inverting operational amplifier operatively connected between the input of said first amplifier and the output of said second amplifier, a control means, for limiting the output amplitude of said oscillator, comprising:

detector means responsive to said oscillator output for developing a cognate signal related to said oscillator output, said detector means including a first buffer amplifier responsive to said oscillator output, a peak detector means responsive to the output of said first buffer amplifier for developing a peak detected signal related to the peaks of said oscillator output, and a second buffer amplifier responsive to said peak detected signal for generating said cognate signal;

reference means for developing a reference voltage;

comparator means responsive to said reference voltage and to said cognate signal for developing a supply voltage, said comparator means including a differential amplifier for developing said supply voltage wherein said supply voltage is an error voltage superimposed on a reference level;

means for providing said supply voltage to the first and second integrating operational amplifiers of said oscillator.

5. The combination according to claim 4 wherein said peak detector means includes:

a diode having its anode terminal operatively connected to said first buffer amplifier and its cathode terminal operatively connected to said second buffer amplifier; and a capacitor connected between said cathode terminal and ground.

6. The combination according to claim 4 wherein said quadrature oscillator further includes:

first means, operatively connected between the output of said inverting operational amplifier and the input of said first integrating operational amplifier, for selectively changing the frequency of said oscillator;

second means, operatively connected between the output of said first integrating operational amplifier and the input of said second integrating operational amplifier, for selectively changing the frequency of said oscillator; and wherein said first and second means operate concomitantly.

* * * * *